United States Patent
Hung et al.

(10) Patent No.: US 8,227,822 B2
(45) Date of Patent: Jul. 24, 2012

(54) LIGHT EMITTING DIODE APPARATUS

(75) Inventors: Chun Chang Hung, Hsin-Chu (TW);
Tung Liang Shao, Hsin-Chu (TW);
Falcon Lin, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 20 days.

(21) Appl. No.: 12/577,895

(22) Filed: Oct. 13, 2009

(65) Prior Publication Data
US 2010/0163898 A1 Jul. 1, 2010

(30) Foreign Application Priority Data
Dec. 25, 2008 (TW) ................................ 97150570 A

(51) Int. Cl.
*H01L 29/18* (2006.01)
*H01L 33/00* (2010.01)

(52) U.S. Cl. ............. 257/98; 257/88; 257/99; 257/100; 257/E33.058; 257/E33.059; 257/E33.066; 257/E33.072; 257/E33.073

(58) Field of Classification Search ......................... None
See application file for complete search history.

(56) References Cited

U.S. PATENT DOCUMENTS

| | | | |
|---|---|---|---|
| 7,579,629 B2 * | 8/2009 | Inoguchi ........................... | 257/98 |
| 7,777,238 B2 * | 8/2010 | Nishida et al. ................... | 257/88 |
| 7,994,518 B2 * | 8/2011 | Wang et al. ....................... | 257/82 |
| 8,093,619 B2 * | 1/2012 | Hayashi ........................... | 257/99 |
| 2001/0022390 A1 * | 9/2001 | Waitl et al. ..................... | 257/666 |
| 2003/0189830 A1 * | 10/2003 | Sugimoto et al. ............. | 362/294 |
| 2004/0036081 A1 * | 2/2004 | Okazaki .......................... | 257/99 |
| 2004/0041222 A1 * | 3/2004 | Loh ................................. | 257/433 |
| 2004/0065894 A1 * | 4/2004 | Hashimoto et al. ........... | 257/100 |
| 2005/0133808 A1 * | 6/2005 | Uraya et al. ..................... | 257/99 |
| 2005/0224829 A1 * | 10/2005 | Negley et al. ................... | 257/99 |
| 2008/0006837 A1 * | 1/2008 | Park et al. ....................... | 257/98 |
| 2008/0191620 A1 * | 8/2008 | Moriyama et al. ............ | 313/506 |
| 2009/0008673 A1 * | 1/2009 | Kato et al. ..................... | 257/100 |
| 2009/0039368 A1 * | 2/2009 | Omae et al. ..................... | 257/98 |
| 2009/0045422 A1 * | 2/2009 | Kato et al. ....................... | 257/98 |
| 2009/0256166 A1 * | 10/2009 | Koike et al. ..................... | 257/98 |

(Continued)

FOREIGN PATENT DOCUMENTS

CN 1599087 A 3/2005

(Continued)

OTHER PUBLICATIONS

China Office Action dated Nov. 20, 2009 for 2009100003460 which is a corresponding Chinese application that cites CN100428512C, CN101123286A, CN1599087A and CN101320773A.

(Continued)

*Primary Examiner* — Hoang-Quan Ho
(74) *Attorney, Agent, or Firm* — WPAT, P.C.; Anthony King

(57) ABSTRACT

A light emitting diode apparatus comprises a substrate having a circuit pattern, a reflection layer disposed on the substrate, at least one light emitting element disposed on the reflection layer, a reflector disposed around the at t one light emitting element, a sealing material formed over the at least one light emitting element and a phosphor layer disposed over the sealing material. The light emitting element comprises a conductive portion electrically coupled to the circuit pattern. In one embodiment, a plurality of light emitting elements are linearly arrayed, and a spacer is disposed between every two adjacent light emitting elements.

14 Claims, 10 Drawing Sheets

U.S. PATENT DOCUMENTS

| | | | |
|---|---|---|---|
| 2009/0261366 A1* | 10/2009 | Eisert et al. | 257/98 |
| 2009/0315057 A1* | 12/2009 | Konishi et al. | 257/98 |
| 2011/0006318 A1* | 1/2011 | Chung | 257/91 |

FOREIGN PATENT DOCUMENTS

| | | |
|---|---|---|
| CN | 101123286 A | 2/2008 |
| CN | 100428512 C | 10/2008 |
| CN | 101320773 | 12/2008 |
| CN | 101320773 A | 12/2008 |
| JP | 2007-112974 | 5/2007 |
| TW | 200536157 | 11/2005 |
| WO | WO2006090804 A1 * | 8/2006 |
| WO | 2007/018039 | 2/2007 |
| WO | WO2007018039 A1 * | 2/2007 |
| WO | WO2007034919 A1 * | 3/2007 |
| WO | WO2008111504 A1 * | 9/2008 |

OTHER PUBLICATIONS

Taiwanese Office Action dated Aug. 19, 2011 for 097150570, which is a corresponding Taiwanese application, that cites TW 200536157A, JP 2007-112974A1, WO 2007/018039A1, CN 101320773A, and US 2005/0133808A1.

* cited by examiner

LIGHT EMITTING DIODE APPARATUS

BACKGROUND OF THE INVENTION

1. Field of the Invention

The present invention relates to a light emitting diode device, and relates more particularly to a light emitting diode device of high light-mixing efficiency that can have larger selection range of bins of light emitting diodes.

2. Description of the Related Art

Due to variations in manufacturing processes, characteristics such as intensities or wavelengths of fabricated light emitting diodes vary from one to another. When light emitting diodes were first introduced as lighting sources, most lighting sources utilized a single light emitting diode. In such arrangements, the influence of the variations between light emitting diodes is not significant.

However, when a plurality of light emitting diodes are arrayed for an application and are not first sorted, noticeable variations in color or luminous intensity may appear. To solve such issue, light emitting diodes are usually characterized in accordance with some parameters thereof. A bin code of each light emitting diode is determined based on test results. When an array of light emitting diodes is prepared for use, light emitting diodes having similar bin codes are selected so that arrayed light emitting diodes will not have non-uniformity issues. Nevertheless, the sorting of light emitting diodes increases cost, and in addition, with the utilization of devices for large luminous area and the requirement of luminous quality, the numerical range of bin codes selected for an array of light emitting diodes is relatively narrowed, and the narrowing of the numerical range of bin codes causes inconvenience and cost increase.

Furthermore, the efficiency of phosphor powder declines with increasing in environmental temperature. Light emitting diodes are luminous devices with high heat generation, and if the design of the heat dissipation module is improper or the control of environmental conditions is poor, the efficiency of the phosphor powder will be affected. Thus, to maintain efficiency of the phosphor powder, further protection of the phosphor powder is required.

Compared to conventional backlight modules, backlight modules using light emitting diodes have a larger projection angle of light in one direction to mix light and at the same time, have a smaller projection angle of light in another direction to direct more light into the backlight module and increase luminous intensity. In summary, use of sorted light emitting diodes to make arrayed light emitting diodes can ensure the luminous quality; however, high cost will affect economic benefit. The efficiency of phosphor powder is influenced by temperature, but no solution is found in the conventional design. Moreover, when light emitting diodes are used in a backlight module, the light projection angles varying in different directions is required, but in the prior art techniques, no technology has been developed to address this issue.

SUMMARY OF THE INVENTION

The present invention proposes a light emitting diode apparatus, which utilizes light diffusing means to achieve better light mixing effect so that the light emitting diode apparatus can select the light emitting elements in a larger numerical range of bin codes. In addition, a sealing material is used to separate a phosphor layer so that the phosphor layer is not affected by heat and the efficiency of the phosphor layer can remain stable. Further, having light convergent and light divergent functions in different directions can facilitate different light incident angles in different directions.

According to one embodiment, the present invention proposes a light emitting diode apparatus, which comprises a substrate having a circuit pattern; a reflection layer disposed on the substrate; at least one light emitting element disposed on the reflection layer; a reflector surrounding the light emitting element; a sealing material disposed around the light emitting element; and a phosphor layer disposed on the sealing material and configured to provide uniformly mixed light. The light emitting element includes a conductive portion. The circuit pattern is electrically coupled to the conductive portion of the light emitting element so that power is transmitted to the light emitting element. The reflector comprises a light emitting opening on its exterior and a first reflection surface disposed within the interior of the reflector.

According to another embodiment, the present invention proposes a light emitting diode apparatus, which comprises a substrate having a circuit pattern; a reflection layer disposed on the substrate; at least one light emitting element disposed on the reflection layer; a reflector disposed around the at least one light emitting element; and a phosphorous sealing material provided over the at least one light emitting element. The at least one light emitting element includes a conductive portion. The circuit pattern is electrically coupled to the conductive portion of the at least one light emitting element so that power is transmitted to the at least one light emitting element. The reflector comprises a light emitting opening at the exterior of the reflector and a first reflection surface disposed within the interior of the reflector. The phosphorus sealing material is a mixture of phosphor powder and silicon polymer.

BRIEF DESCRIPTION OF THE DRAWINGS

The invention will be described according to the appended drawings in which.

DETAILED DESCRIPTION OF THE INVENTION

Figure 1:
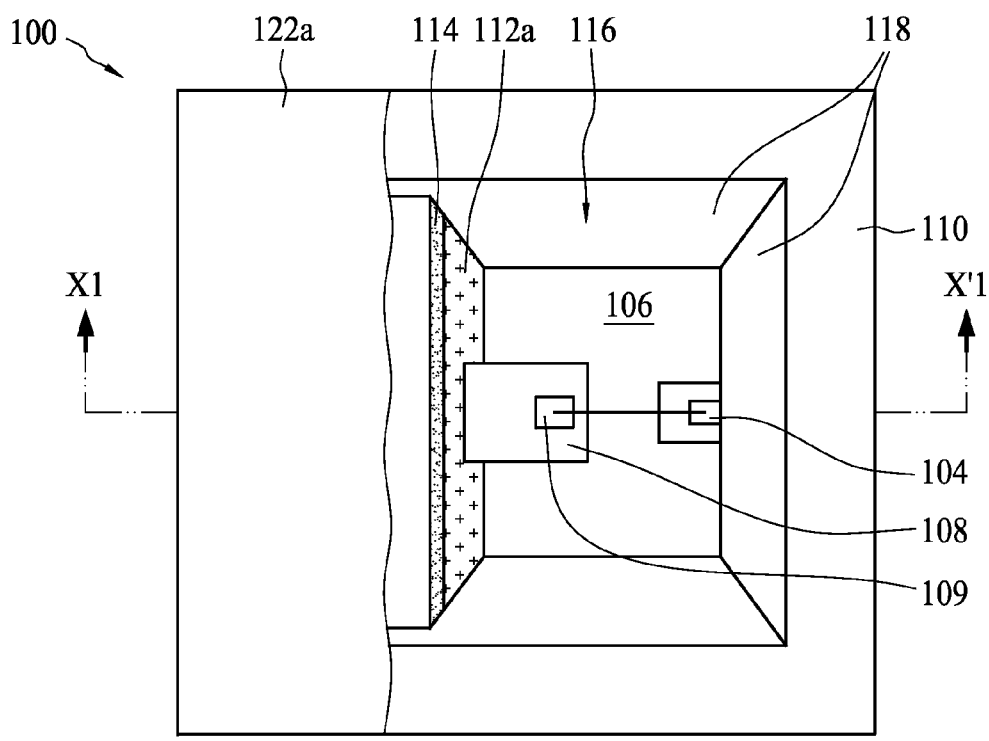
FIG. 1 is a schematic top view showing a light emitting diode apparatus according to the first embodiment of the present invention.
Figure 2:
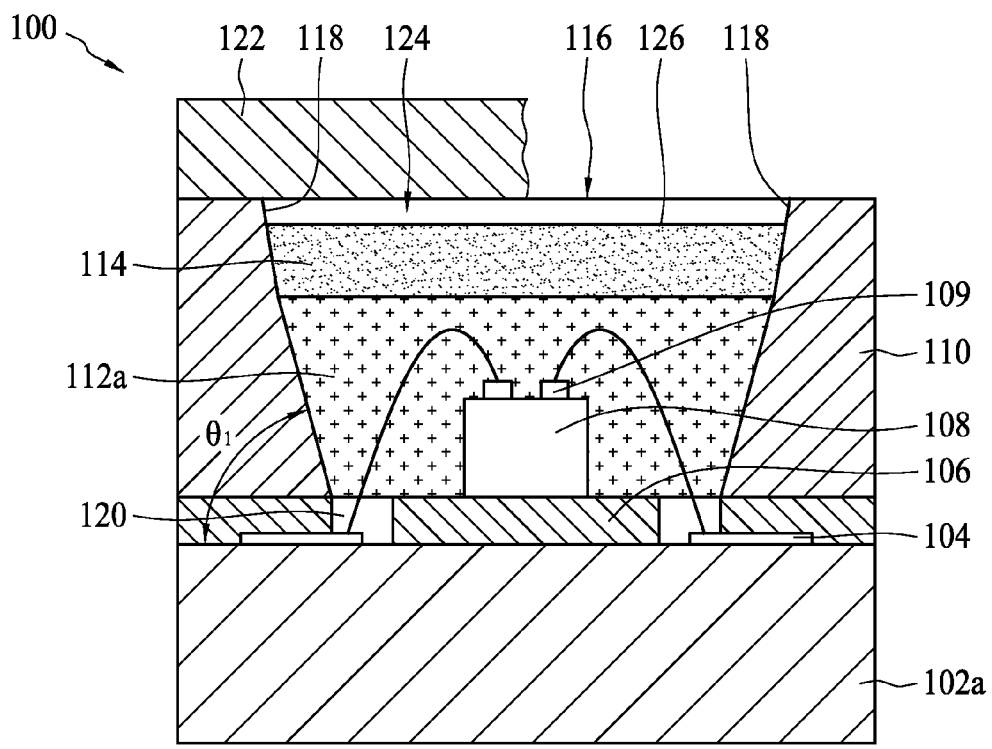
FIG. 2 is a sectional view along section line X1-X'1 of FIG. 1.

FIG. 1 is a schematic top view showing a light emitting diode apparatus 100 according to the first embodiment of the present invention. FIG. 2 is a sectional view along section line X1-X'1 of FIG. 1. The light emitting diode apparatus 100 comprises a substrate 102a having a circuit pattern 104, a reflection layer 106 disposed on the substrate 102a, at least one light emitting element 108 disposed on the reflection layer 106, a reflector 110 surrounding the light emitting element 108, a sealing material 112a disposed around the at least one light emitting element 108, and a phosphor layer 114 disposed on the sealing material 112a and configured to provide uniformly mixed light. The light emitting element 108 comprises a conductive portion 109, and the circuit pattern 104 of the substrate 102a is coupled to the conductive portion 109, and thereby transmits power to the light emitting element 108.

The reflector 110 comprises a light emitting opening 116 on the exterior of the reflector 110 and a first reflection surface 118 disposed within the interior of the reflector 110. The first reflection surface 118 is an inclined surface, and reflects the light laterally emitted from the light emitting element 108 toward the light emitting opening 116. The reflector 110 can be disposed on the reflection layer 106; however, such an arrangement is not absolute, and the reflector can alternatively be disposed on the substrate 102a. In the present embodiment, the included angle $\theta_1$ between the first reflection surface 118 and the substrate 102a is between 30° and 80°. The reflector 110 is made of reflective material and has capability to reflect the emitted light from the light emitting element 108. The material of the reflector 110 may include metallic material or non-metallic material. The metallic material may contain titanium, gold, aluminum, silver, platinum, palladium, or metallic compound of the above. The non-metallic material may contain polypthalamide, ceramics, and polycarbonate. The non-metallic material may be a polymer, which is blended with a highly reflective material, and the highly reflective material may contain non-metallic material or metallic material.

The reflection layer 106 comprises at least one opening 120, and the circuit pattern 104 is electrically coupled to the conductive portion 109 of the light emitting element 108 via the opening 120. The circuit pattern 104 contains contact points configured to connect to an external power source, and the external power source provides power to the light emitting element 108 through the circuit pattern 104. The reflection layer 106 is highly reflective. It can be a metallic metal reflection layer. The material of the metallic reflection layer may comprise titanium, gold, aluminum, silver, platinum, palladium, or metallic compound thereof. The material of the reflection layer 106 may also be inorganic materials such as titanium dioxide, aluminum oxide, zinc oxide, zinc sulfide, barium sulfate, antimony oxide, magnesium oxide, magnesium fluoride, calcium carbonate, boron nitride, or mixtures of any of the foregoing.

In the present embodiment, the phosphor layer 114 is disposed upon a surface of the sealing material 112a and is received within the reflector 110. Compared to prior art light emitting apparatuses, because the sealing material 112a isolates the phosphor layer 114 from the substrate 102a, the heat from the light emitting element 108 has no effect on the phosphor layer 114. Therefore, the efficiency of the phosphor layer 114 is stabilized. The phosphor layer 114 may be a mixture of phosphor powder and silicone polymer or a mixture of phosphor powder and epoxy resin.

An optical microstructure film 122 can be disposed on the light emitting opening 116 of the reflector 110. The optical microstructure film 122 and the phosphor layer 114 can be separated from each other by a gap 124 as shown in FIG. 2, or can be joined together. The optical microstructure film 122 is configured to provide hybrid optical effects including light convergent and divergent functions. The optical microstructure film 122 may include a plurality of optical films, each of which has a single optical effect, or it may be an optical film having the hybrid optical effects including convergent and divergent functions.

The sealing material 112a includes silicone polymer or epoxy resin. The sealing material 112a can be interdispersed with light scattering particles and the light scattering particles may uniformly diffuse the penetrating light. Generally, if light scattering particles with smaller diameters are used, the weight ratio of the light scattering particles shall be higher such that better light mixing effect may be achieved. In the present embodiment, the weight ratio of the light scattering particles interdispersed in the sealing material 112a may be in the range of 0.1% to 20%. Preferably, when the light scattering particles with diameters in the range of 1 to 30 micrometers are used, the weight ratio of the light scattering particles can be in the range of 0.2% to 10%.

The material of the substrate 102a can be any one selected from the group consisting of glass, ceramics, Bakelite, epoxy resin, polyethylene terephthalate, polyimide, cyanate ester, bismaleimide triazine, FR-4 resin type polymer, and FR-5 resin type polymer.

Figure 3:
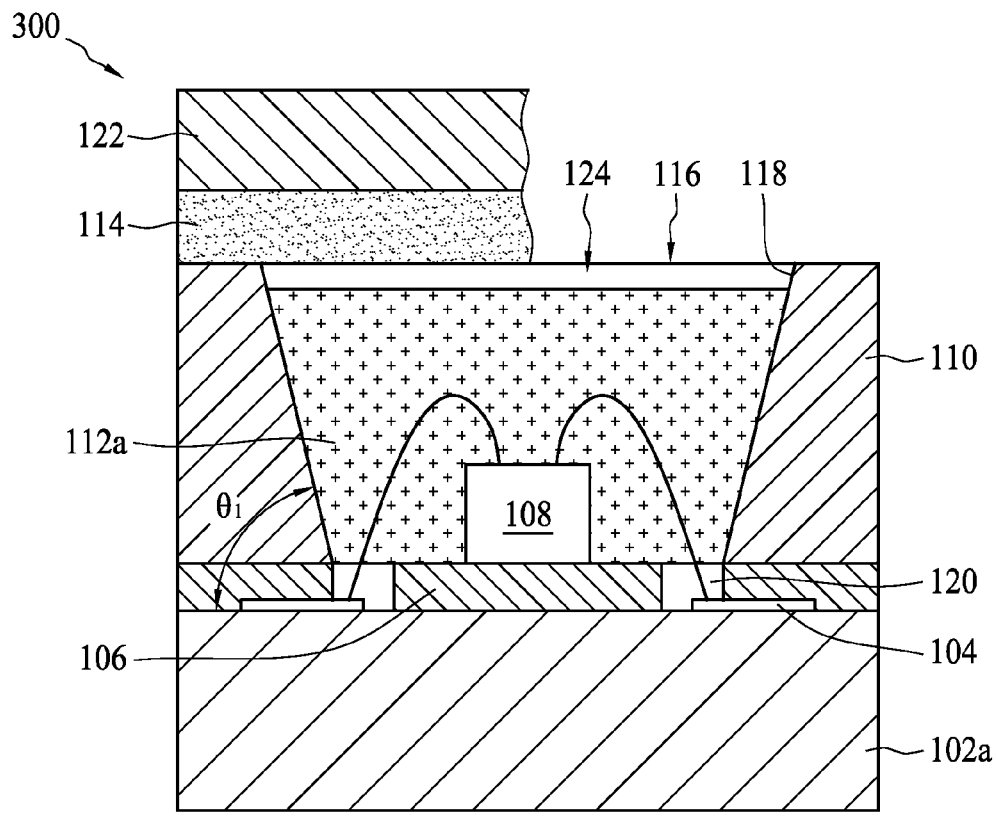
FIG. 3 shows a sectional view of a light emitting diode apparatus according to the second embodiment of the present invention.

FIG. 3 shows a sectional view of a light emitting diode apparatus 300 according to the second embodiment of the present invention. The light emitting diode apparatus 300 comprises a substrate 102a having a circuit pattern 104, a reflection layer 106 disposed on the substrate 102a, at least one light emitting element 108 disposed on the reflection layer 106, a reflector 110 surrounding the at least one light emitting element 108, and a sealing material 112a disposed around the at least one light emitting element 108. The reflector 110 comprises a light emitting opening 116 at the exterior of the reflector 110 and at least one optical microstructure film 122 disposed on the light emitting opening 116. A phosphor layer 114 is formed on the optical microstructure film 122 and is located between the optical microstructure film 122 and the light emitting opening 116, and thereby achieves uniform light mixing effect. The phosphor layer 114 is separated from the substrate 102a so that the phosphor layer 114 will not be affected by the heat from the light emitting element 108, and the efficiency thereof can be stabilized. In the present embodiment, the sealing material 112a and the phosphor layer 114 can be separated by a gap 124. In another embodiment, the sealing material 112a and the phosphor layer 114 can be attached to one another. The sealing material can be interdispersed with light scattering particles so as to diffuse the passing light uniformly.

Figure 4:
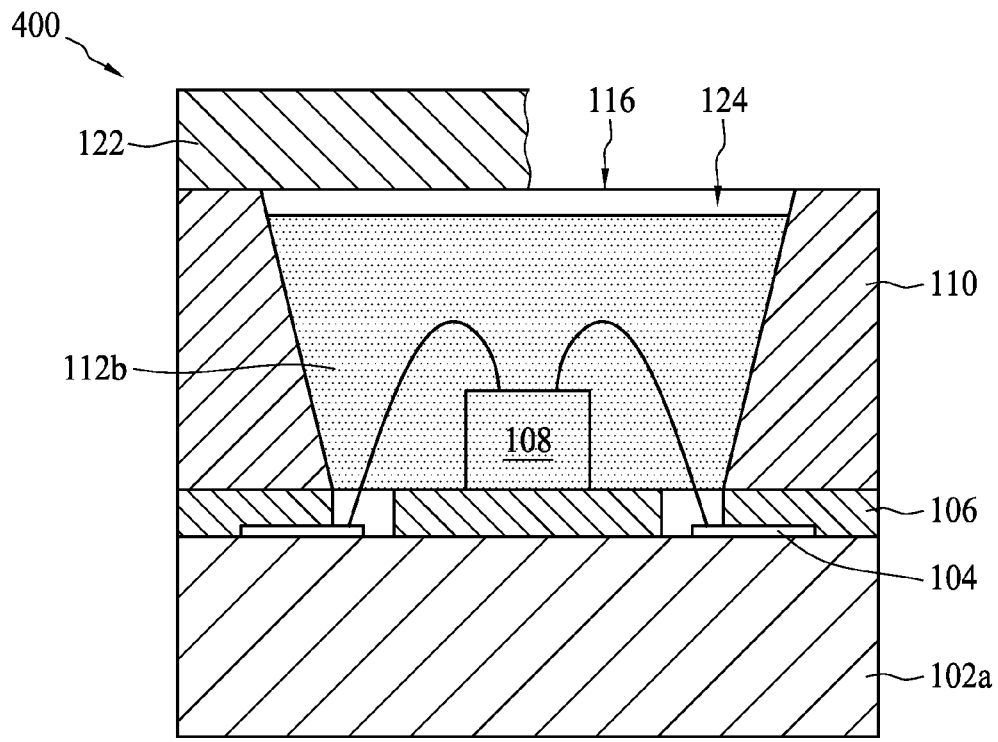
FIG. 4 shows a sectional view of a light emitting diode apparatus according to the third embodiment of the present invention.

FIG. 4 shows a sectional view of a light emitting diode apparatus 400 according to the third embodiment of the present invention. The light emitting diode apparatus 400 comprises a substrate 102a having a circuit pattern 104, a reflection layer 106 disposed on the substrate 102a, at least one light emitting element 108 disposed on the reflection layer 106, a reflector 110 surrounding the light emitting element 108, and a sealing material 112b disposed around the at least one light emitting element 108, wherein the sealing material 112b is blended with phosphor powder. Within the sealing material 112b, light scattering particles can be interdispersed to uniformly diffuse passing light. The reflector 110 comprises a light emitting opening 116 at the exterior of the reflector 110 and at least one optical microstructure film 122 is disposed on the light emitting opening 116. In the present embodiment, the sealing material 112b is separated from the optical microstructure film 122 by a gap 124. In another embodiment, the sealing material 112b and the optical microstructure film 122 can be attached to one another.

Figure 5:
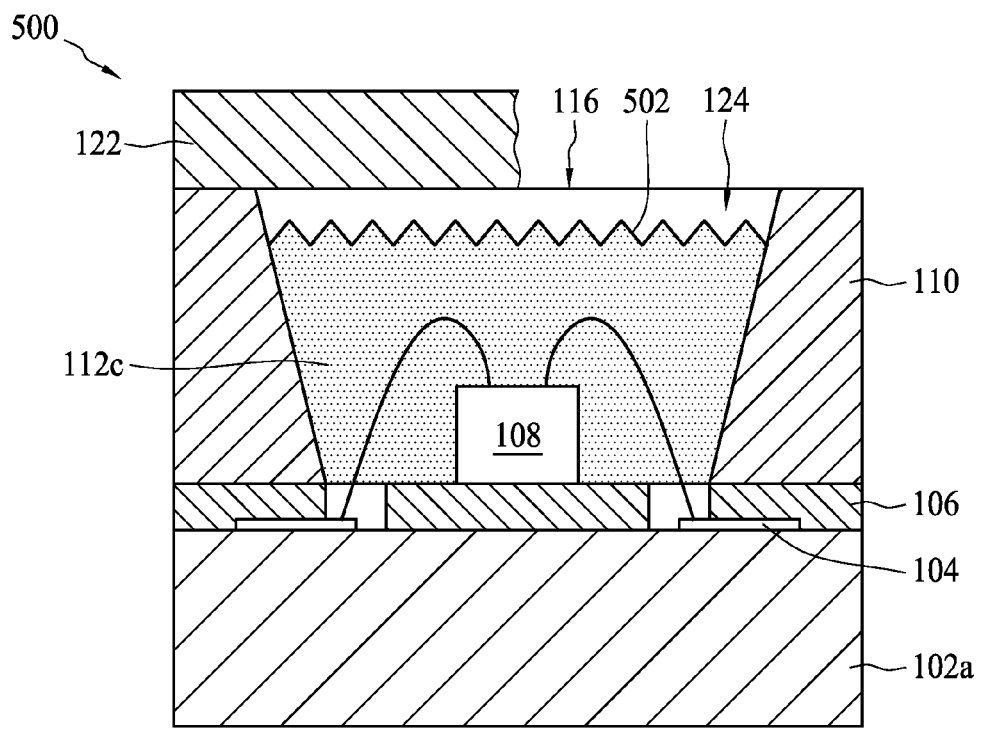
FIG. 5 shows a sectional view of a light emitting diode apparatus according to the fourth embodiment of the present invention.

FIG. 5 shows a sectional view of a light emitting diode apparatus 500 according to the fourth embodiment of the present invention. The light emitting diode apparatus 500 comprises a substrate 102a having a circuit pattern 104, a reflection layer 106 disposed on the substrate 102a, at least one light emitting element 108 disposed on the reflection layer 106, a reflector 110 surrounding the at least one light emitting element 108, and a sealing material 112c disposed around the at least one light emitting element 108, wherein the sealing material 112c is blended with phosphor powder and the surface of the sealing material 112c has an optical microstructure. The optical microstructure may contain a prism arrangement and a micro lens. The sealing material 112c can be interdispersed with light scattering particles to uniformly diffuse passing light. The reflector 110 comprises a light emitting opening 116 at the exterior of the reflector 110 and at least one optical microstructure film 122 disposed on the light emitting opening 116.

Figure 6:
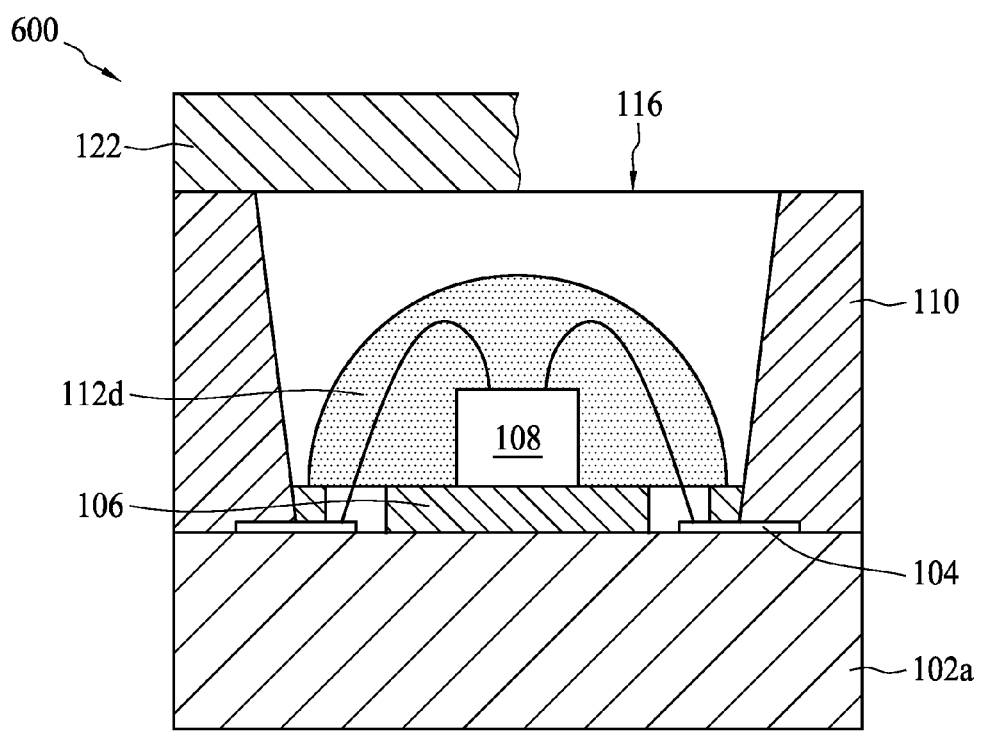
FIG. 6 shows a sectional view of a light emitting diode apparatus according to the fifth embodiment of the present invention.

FIG. 6 shows a sectional view of a light emitting diode apparatus 600 according to the fifth embodiment of the present invention. The light emitting diode apparatus 600 comprises a substrate 102a having a circuit pattern 104, at least one light emitting element 108 disposed on the substrate 102a, a reflector 110 surrounding the at least one light emitting element 108 and disposed on the substrate 102a, a reflection layer 106 disposed at the interior bottom of the reflector 110 and located between the substrate 102a and the at least one light emitting element 108, and a sealing material 112d disposed around the at least one light emitting element 108, wherein the sealing material 112d is blended with phosphor powder and is formed into a lens with curved surface during manufacturing. The sealing material 112d may be interdispersed with light scattering particles to uniformly diffuse passing light. The reflector 110 comprises a light emitting opening 116 at the exterior of the reflector 110 and at least one optical microstructure film 122 disposed on the light emitting opening 116.

Figure 7:
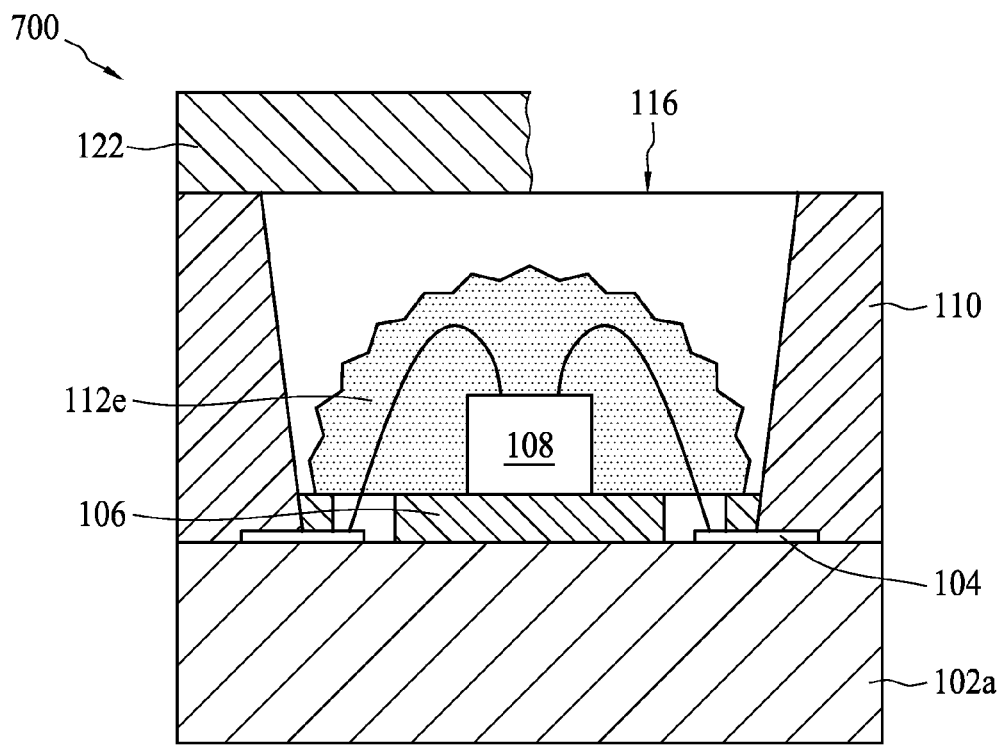
FIG. 7 shows a sectional view of a light emitting diode apparatus according to the sixth embodiment of the present invention.

FIG. 7 shows a sectional view of a light emitting diode apparatus 700 according to the sixth embodiment of the present invention. The light emitting diode apparatus 700 comprises a substrate 102a having a circuit pattern 104, a light emitting element 108 disposed on the substrate 102a, a reflector 110 surrounding the light emitting element 108 and disposed on the substrate 102a, a reflection layer 106 disposed at the interior bottom of the reflector 110 and located between the substrate 102a and the light emitting element 108, and a sealing material 112e disposed around the light emitting element 108, wherein the sealing material 112e is blended with phosphor powder and is formed into a lens with a surface having an optical microstructure during manufacturing. The optical microstructure may contain a prism arrangement or a micro lens. The sealing material 112e may be interdispersed with light scattering particles to uniformly diffuse passing light. The reflector 110 comprises a light emitting opening 116 at the exterior of the reflector 110 and at least one optical microstructure film 122 disposed on the light emitting opening 116.

Figure 8:
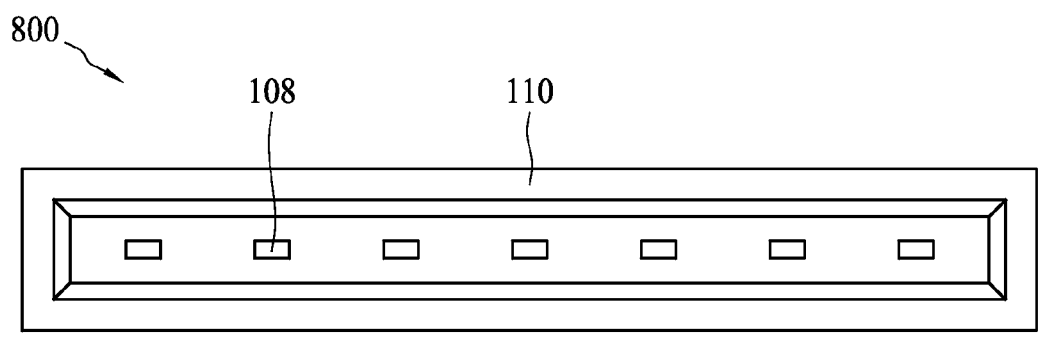
FIG. 8 shows a schematic top view of a light emitting diode apparatus according to the seventh embodiment of the present invention.

FIG. 8 shows a schematic top view of a light emitting diode apparatus 800 according to the seventh embodiment of the present invention. The light emitting diode apparatus 800 is a linear light source comprising a plurality of light emitting elements 108 arrayed in a row line or in a column line and received within a reflector 110. Within the reflector 110, a sealing material as described in the above embodiments can be applied around the light emitting elements 108. The sealing material may contain light scattering particles. In one embodiment, the sealing material is mixed with phosphor powder; and in another embodiment, a phosphor layer is deposited on the sealing material.

Figure 9:
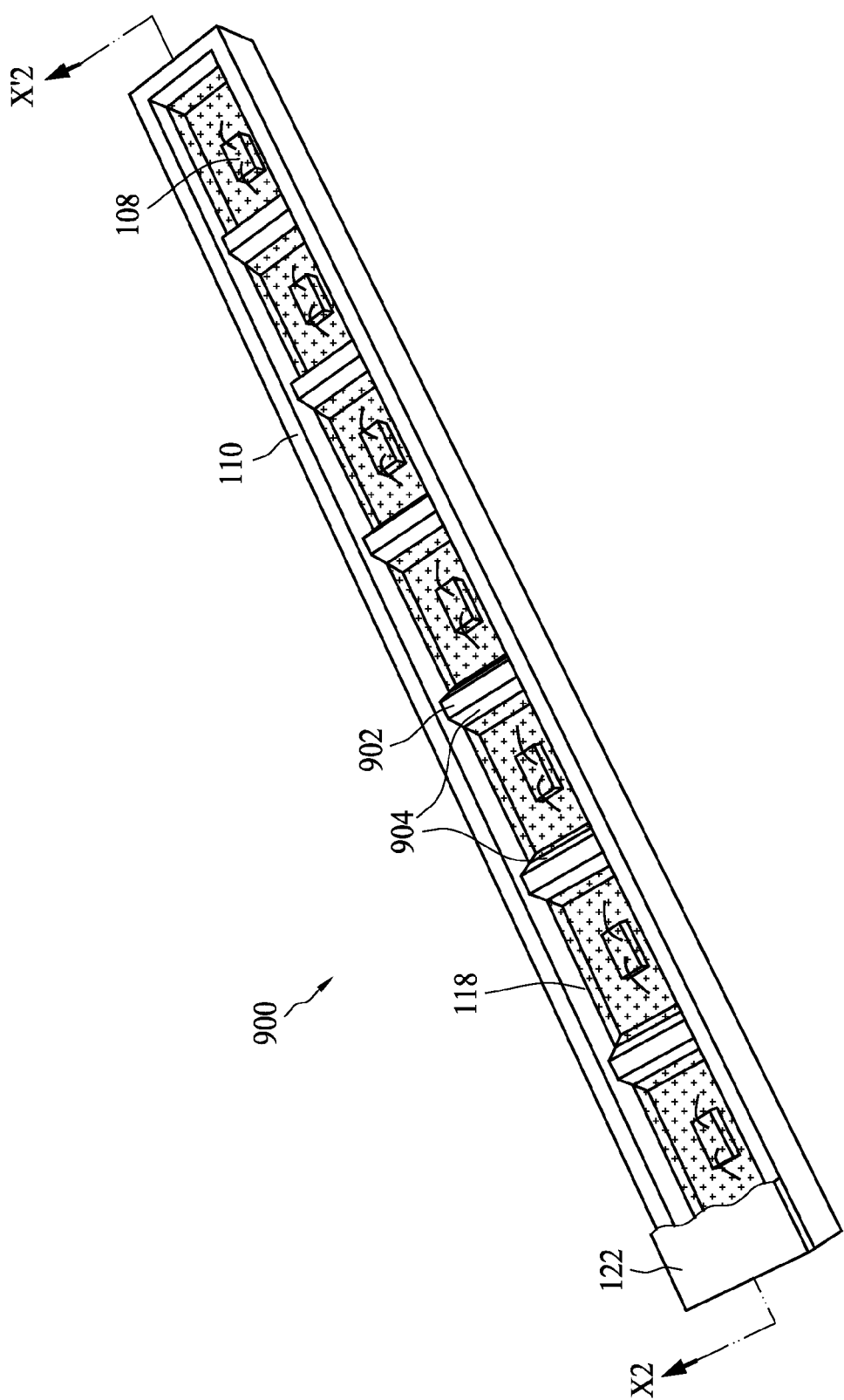
FIG. 9 shows a schematic top view of a light emitting diode apparatus according to the eighth embodiment of the present invention.
Figure 10:
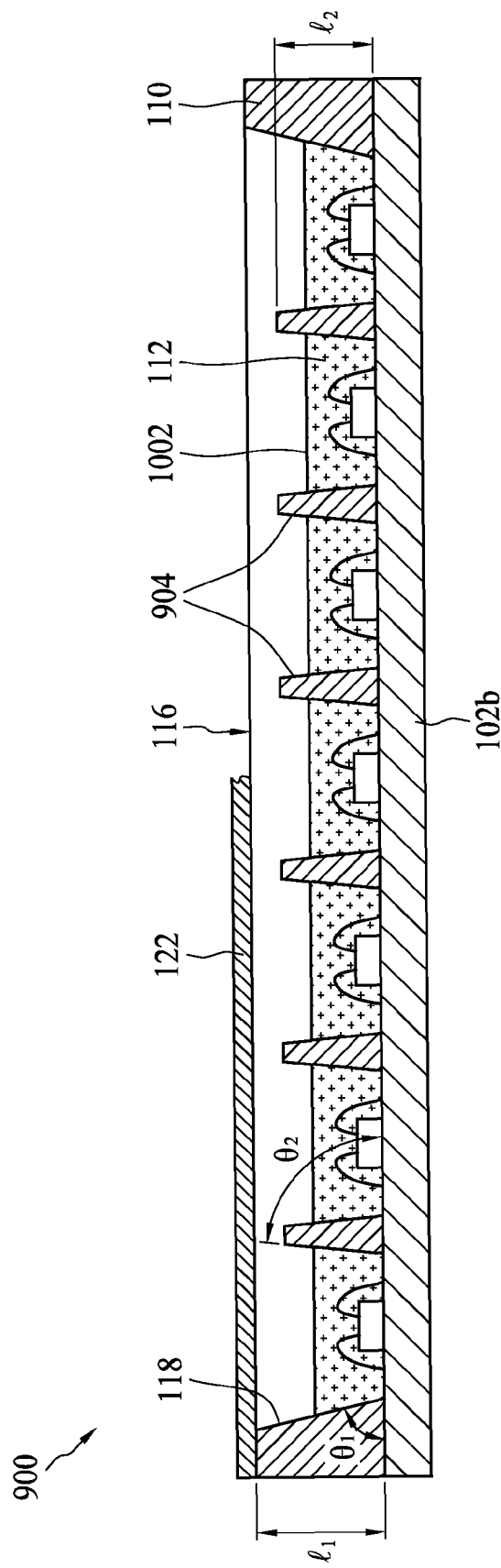
FIG. 10 is a sectional view along section line X2-X'2 of FIG. 9.

FIG. 9 shows a schematic top view of a light emitting diode apparatus 900 according to the eighth embodiment of the present invention. FIG. 10 is a sectional view along section line X2-X'2 of FIG. 9. The light emitting diode apparatus 900 of FIGS. 9 and 10 is a linear light source comprising a plurality of light emitting elements 108 linearly arrayed in row or column arrangement and received within a reflector 110. In the reflector 110, the side wall adjacent to the light emitting elements 108 is formed into a first reflection surface 118. Between every adjacent pair of light emitting elements, a spacer 902 is disposed. Each spacer 902 contains a second reflection surface 904 to reflect the light emitted laterally from the respective light emitting element 108 toward a light emitting opening 116. The spacer 902 has a height $1_2$, which can be less than the height $1_1$ of the reflector 110. The second reflection surface 904 of the spacer 902 is also an inclined surface, and the included angle $\theta_2$ between the second reflection surface 904 and the substrate 102b can be different from the included angle $\theta_1$ between the first reflection surface 118 and the substrate 102b. In the present embodiment, the included angle $\theta_1$ between the first reflection surface 118 and the substrate 102b is in the range of from 30° to 80°; and the included angle $\theta_2$ between the second reflection surface 904 and the substrate 102b is in the range of from 15° to 80°. The spacers 902 and the reflector 110 can be integrally formed, and both have the capability to reflect the light emitted from the light emitting elements 108 because they are made of reflective material. The material of the spacers 902 and the reflector 110 may include metallic material or non-metallic material. The metallic material may contain titanium, gold, aluminum, silver, platinum, palladium, or metallic compound of the above. The non-metallic material may contain polypthalamide, ceramics, and polycarbonate. The non-metallic material may be a polymer, which is blended with a highly reflective material, and the highly reflective material may contain non-metallic material or metallic material.

Each light emitting element 108 may be covered with a sealing material 112, and the sealing material 112 may contain light scattering particles. In one embodiment, the sealing material 112 is mixed with phosphor powder; and in another embodiment, a phosphor layer is deposited on the sealing material 112. In one embodiment, the light emitting element 108 may be used with phosphor powder emitting complimentary light to generate output white light. In another embodiment, the plurality of light emitting elements 108 comprises red (R) light emitting elements, blue (B) light emitting elements, and green (G) light emitting elements, and the plurality of the light emitting elements can be arranged in manners such as RGB, GRGB or RGRGB. Such arrangements may uniformly mix the red-color, the blue-color, and the green-color light to produce white light. The sealing material 112 can be filled to an extent that the sealing material 112 is separated by the spacers 902; the sealing material 112 can cover the spacers 902; or the sealing material can be filled to reach the light emitting opening 116.

The sealing material may include a surface 1002, on which an optical microstructure is formed. The optical microstructure can diverge the light emitted from the light emitting elements 108 in a direction along the elongated side of the light emitting diode apparatus 900, and converge the light in a direction along the short side of the light emitting diode apparatus 900.

On the light emitting opening 116, an optical microstructure film 122 can be disposed. The optical microstructure film 122 can provide hybrid light convergent and divergent functions. Using the optical microstructure film 122, the light emitted from the light emitting elements 108 can diverge the light emitted from the light emitting elements 108 in a direction along the elongated side of the light emitting diode apparatus 900, and converge the light in a direction along the short side of the light emitting diode apparatus 900.

Figure 11:
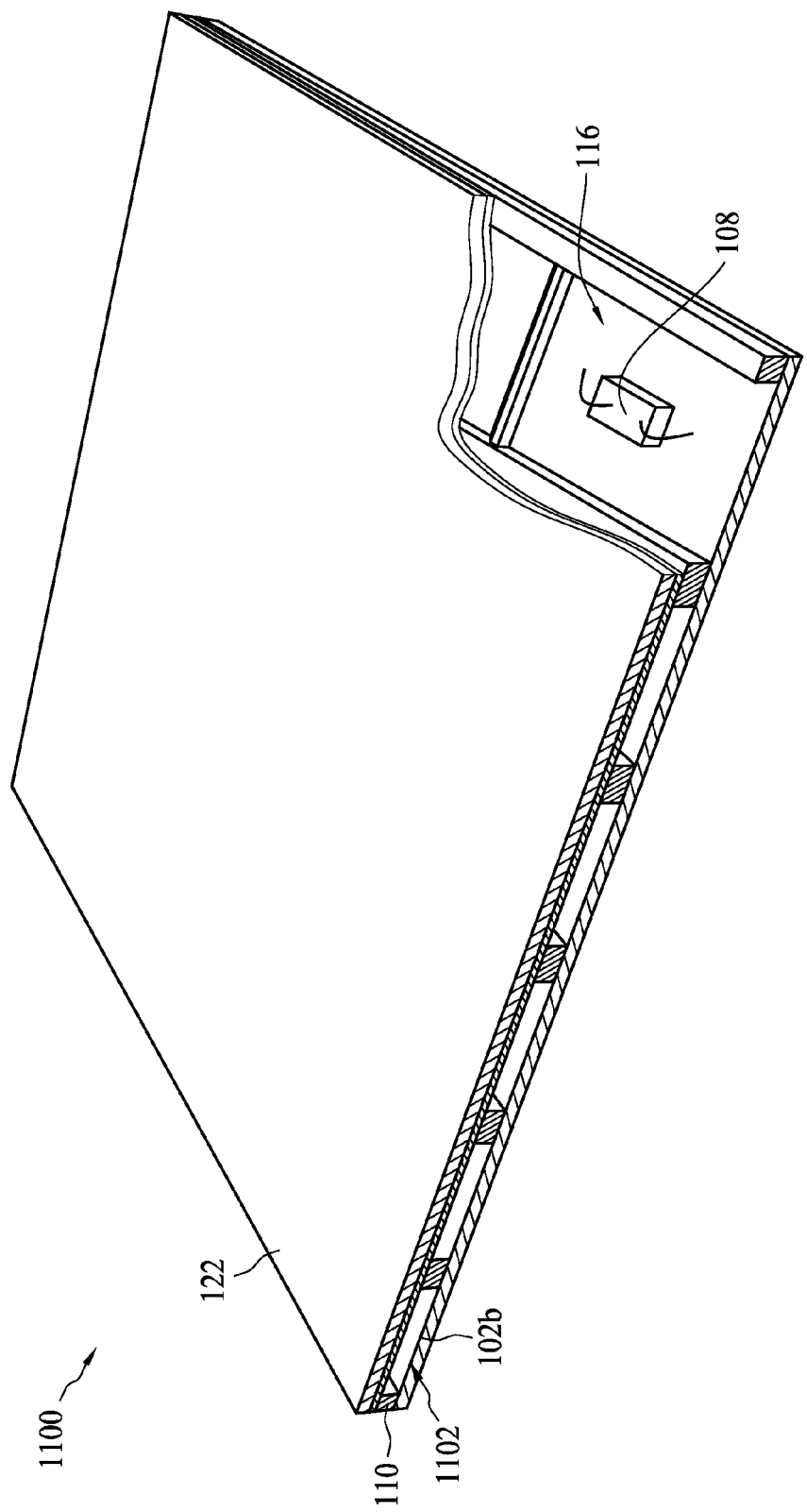
FIG. 11 is a perspective view of a light emitting diode apparatus according to the ninth embodiment of the present invention.

FIG. 11 is a perspective view of a light emitting diode apparatus 1100 according to the ninth embodiment of the present invention. The light emitting diode apparatus 1100 may comprise a plurality of light bars 1102 to form a planar light emitting apparatus. Each light bar 1102 comprises a plurality of light emitting elements 108 linearly arrayed in row or column arrangement and received within a reflector 110, having a configuration as shown in the seventh and eighth embodiments. Each light emitting element 108 may be covered with a sealing material, and the sealing material may contain light scattering particles. On the light emitting opening 116 of the reflector 110, at least one optical microstructure film 122 may be disposed. In one embodiment, the sealing material is mixed with phosphor powder; and in another embodiment, a phosphor layer is disposed on the sealing material or located between the optical microstructure film 122 and the light emitting opening 116 of the reflector 110.

Figure 12:
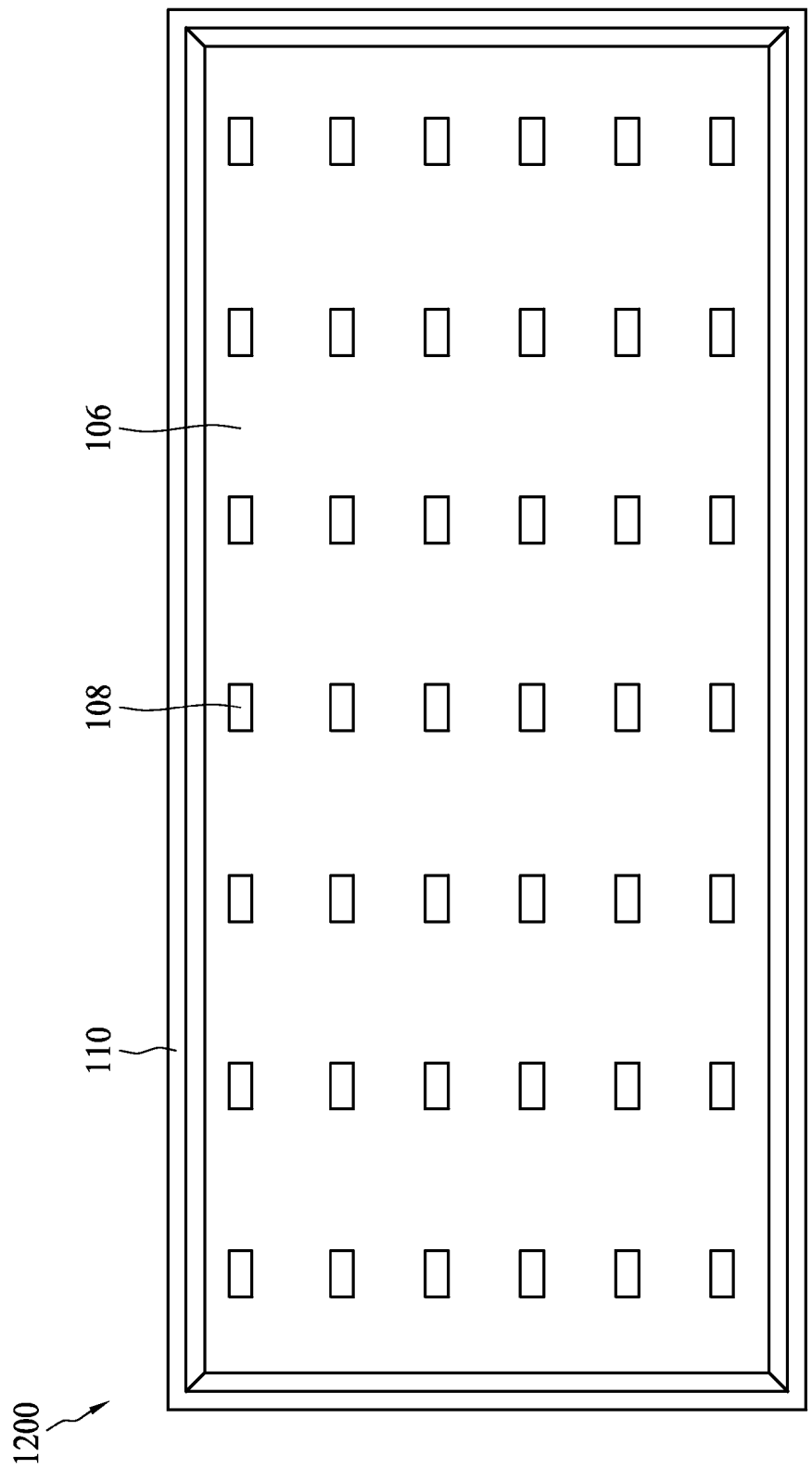
FIG. 12 shows a schematic top view of a light emitting diode apparatus according to the tenth embodiment of the present invention.

FIG. 12 shows a schematic top view of a light emitting diode apparatus 1200 according to the tenth embodiment of the present invention. The light emitting diode apparatus 1200 is a planar light source comprising a plurality of matrix-arrayed light emitting elements 108, which are received within a reflector 110. The distance between the light emitting elements 108 along the row direction can be different or the same as the distance of the light emitting elements 108 along the column direction.

Figure 13:
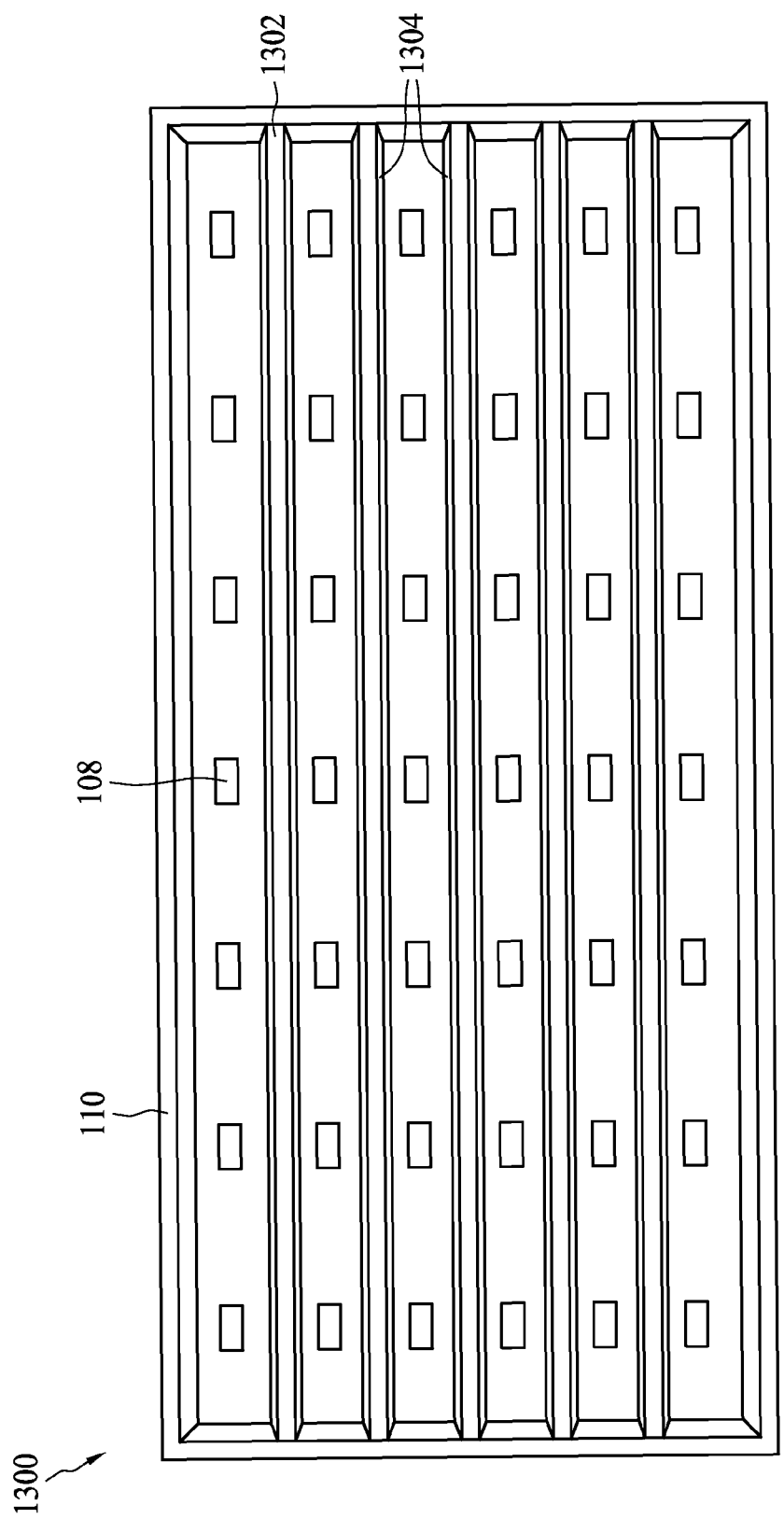
FIG. 13 shows a schematic top view of a light emitting diode apparatus according to the eleventh embodiment of the present invention.

FIG. 13 shows a schematic top view of a light emitting diode apparatus 1300 according to the eleventh embodiment of the present invention. The light emitting diode apparatus 1300 comprises a plurality of matrix-arrayed light emitting elements 108 received within a reflector 110 using a first reflection surface as its interior side wall, wherein between every two adjacent rows or columns, a spacer 1302 having a second reflection surface 1304 is disposed.

Figure 14:
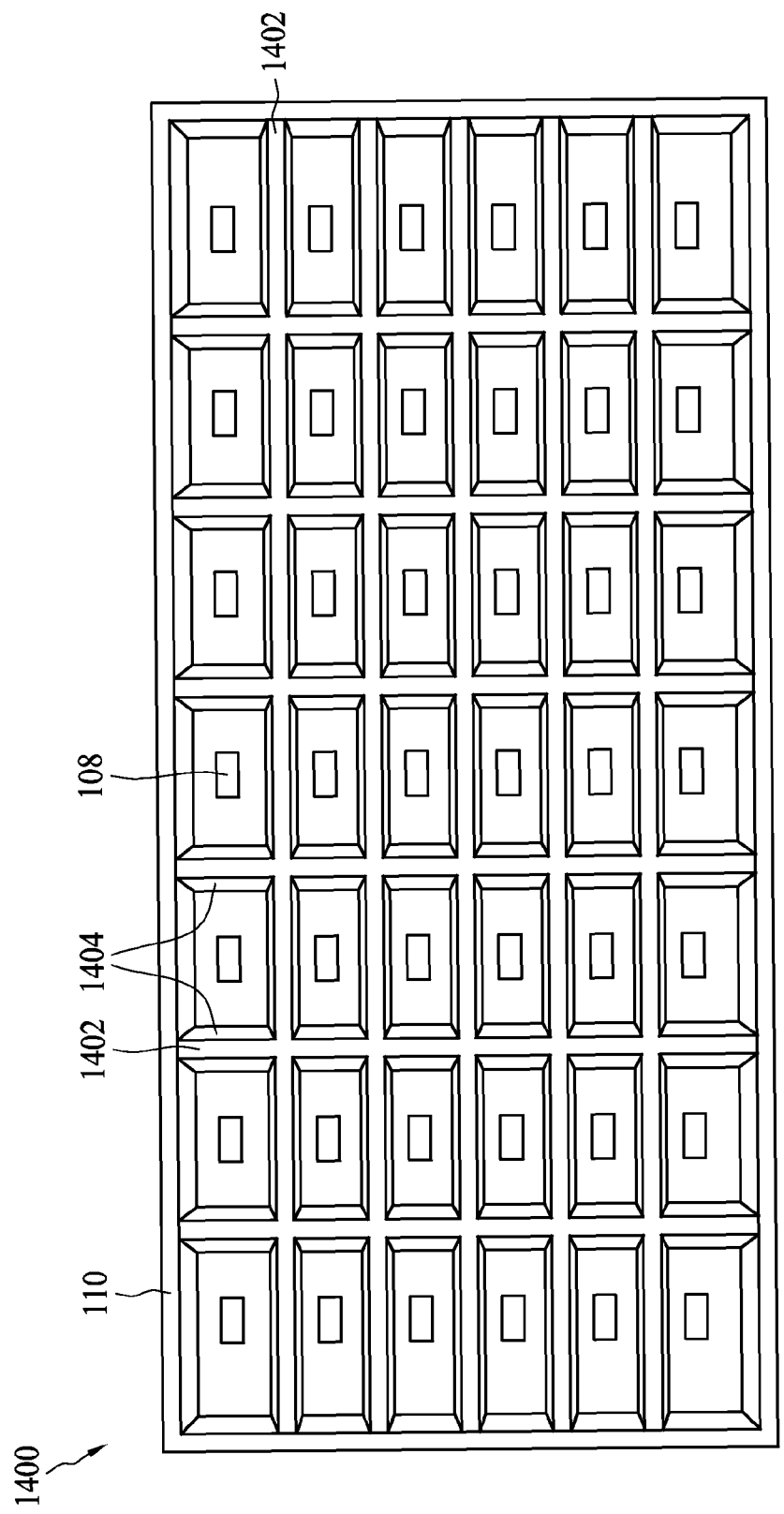
FIG. 14 is a schematic top view of a light emitting diode apparatus according to the twelfth embodiment of the present invention.

FIG. 14 is a schematic top view of a light emitting diode apparatus 1400 according to the twelfth embodiment of the present invention. The light emitting diode apparatus 1400 comprises a plurality of matrix-arrayed light emitting elements 108 received within a reflector 110 using a first reflection surface as its interior side wall. Within the reflector 110, a grid-like spacer 1402 having a second reflection surface 1404 is disposed. The grid-like spacer 1402 separates the light emitting elements from one another individually, with a second reflection surface 1404 facing the light emitting elements.

The above-described embodiments of the present invention are intended to be illustrative only. Numerous alternative embodiments may be devised by persons skilled in the art without departing from the scope of the following claims.

What is claimed is:

1. A light emitting diode apparatus, comprising:
   a substrate having a circuit pattern;
   a reflection layer disposed on the substrate and the circuit pattern;
   at least one light emitting element having a conductive portion and disposed on the reflection layer, wherein the circuit pattern is electrically coupled to the conductive portion of the at least one light emitting element so that power is transmitted to the at least one light emitting element;
   a reflector formed on the reflection layer and surrounding the at least one light emitting element comprising a light emitting opening of the reflector and a first reflection surface disposed within the interior of the reflector, wherein the reflection layer is between the substrate and the reflector;
   a sealing material disposed around the at least one light emitting element; and
   a phosphor layer disposed on the sealing material and configured to provide uniformly mixed light.

2. The light emitting diode apparatus of claim 1, further comprising an optical microstructure film, wherein the phosphor layer is disposed on the light emitting opening and attached to the optical microstructure film.

3. The light emitting diode apparatus of claim 1, wherein a gap is formed between the sealing material and the phosphor layer.

4. The light emitting diode apparatus of claim 1, further comprising an optical microstructure film disposed on the light emitting opening, wherein the phosphor layer is received within the reflector.

5. The light emitting diode apparatus of claim 4, wherein a gap separates the optical microstructure film and the phosphor layer.

6. The light emitting diode apparatus of claim 1, wherein the at least one light emitting element comprises a plurality of arrayed light emitting elements.

7. The light emitting diode apparatus of claim 6, wherein the plurality of light emitting elements are linearly arrayed, and a spacer having a second reflection surface is disposed between every two adjacent light emitting elements.

8. The light emitting diode apparatus of claim 6, wherein the plurality of light emitting elements are arrayed in a matrix, and a spacer having a second reflection surface is disposed between every two adjacent rows of the light emitting elements.

9. The light emitting diode apparatus of claim 6, further comprising a grid-like spacer having a second reflection surface, wherein the light emitting elements are separated from one another by the grid-like spacer, with the second reflection surface facing the light emitting elements.

10. The light emitting diode apparatus of claim 9, wherein an angle between the first reflection surface and the substrate is between 30° and 80°, and an angle between the second reflection surface and the substrate is between 15° and 80°.

11. The light emitting diode apparatus of claim 8, wherein an angle between the first reflection surface and the substrate is between 30° and 80°, and an angle between the second reflection surface and the substrate is between 15° and 80°.

12. The light emitting diode apparatus of claim 7, wherein an angle between the first reflection surface and the substrate is between 30° and 80°, and an angle between the second reflection surface and the substrate is between 15° and 80°.

13. The light emitting diode apparatus of claim 1, wherein the reflection layer comprises at least one opening, and the circuit pattern is electrically coupled to the conductive portion by a wire through the at least one opening to provide power to the at least one light emitting element.

14. The light emitting diode apparatus of claim 1, wherein the sealing material includes a surface having an optical microstructure.

* * * * *